United States Patent
Choi et al.

(10) Patent No.: US 8,081,501 B2
(45) Date of Patent: *Dec. 20, 2011

(54) MULTI-LEVEL NONVOLATILE MEMORY DEVICE USING VARIABLE RESISTIVE ELEMENT

(75) Inventors: Byung-Gil Choi, Yongin-si (KR); Du-Eung Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 281 days.

This patent is subject to a terminal disclaimer.

(21) Appl. No.: 12/398,364

(22) Filed: Mar. 5, 2009

(65) Prior Publication Data

US 2009/0225594 A1 Sep. 10, 2009

(30) Foreign Application Priority Data

Mar. 7, 2008 (KR) .................. 10-2008-0021621
Dec. 5, 2008 (KR) .................. 10-2008-0123328

(51) Int. Cl.
*G11C 11/00* (2006.01)

(52) U.S. Cl. ........ 365/148; 365/163; 365/158; 365/159; 365/171; 365/189.15; 365/189.07; 365/189.09

(58) Field of Classification Search .................. 365/148, 365/163, 158, 159, 171, 189.15, 189.07, 365/189.09

See application file for complete search history.

(56) References Cited

U.S. PATENT DOCUMENTS

| | | | | |
|---|---|---|---|---|
| 7,391,644 | B2 * | 6/2008 | Cho et al. | 365/163 |
| 7,548,467 | B2 * | 6/2009 | Kim et al. | 365/189.09 |
| 7,639,522 | B2 * | 12/2009 | Cho et al. | 365/148 |
| 2009/0262573 | A1 * | 10/2009 | Choi et al. | 365/163 |

FOREIGN PATENT DOCUMENTS

| | | |
|---|---|---|
| JP | 09-069295 | 3/1997 |
| JP | 2006-172707 | 6/2006 |
| KR | 1020000033906 | 6/2000 |
| KR | 1020000056516 | 9/2000 |

* cited by examiner

*Primary Examiner* — Fernando Hidalgo
(74) *Attorney, Agent, or Firm* — F. Chau & Associates, LLC

(57) ABSTRACT

A multi-level nonvolatile memory device using variable resistive element with improved reliability of read operations is provided. A multi-level nonvolatile memory device comprises a multi-level memory which includes a resistance element, wherein the resistance level of the resistance element is variable depending on data stored in the multi-level memory cell, and a read circuit which provides the multi level memory cell with a read bias and performs a sensing operation in response to the read bias, wherein the read bias has at least two levels during a read cycle.

17 Claims, 8 Drawing Sheets

MULTI-LEVEL NONVOLATILE MEMORY DEVICE USING VARIABLE RESISTIVE ELEMENT

CROSS REFERENCE TO RELATED APPLICATION

This application claims priority to Korean Patent Application No. 10-2008-0021621 filed on Mar. 7, 2008, and 10-2008-0123328 filed on Dec. 5, 2008 in the Korean Intellectual Property Office, the disclosure of which is incorporated by reference herein in its entirety.

BACKGROUND OF THE INVENTION

1. Technical Field

The present disclosure relates to multi-level nonvolatile memory devices and methods of operation, more particularly, to multi-level nonvolatile memory devices whose memory cells include variable resistance element.

2. Description of the Related Art

The bit data of DRAM (Dynamic RAM) and flash memory devices are usually determined by the level of charge stored in memory cells. However, in the case of some nonvolatile memory devices bit data can be determined by the level of current which flows through resistance materials of memory cells. These nonvolatile memory devices include PRAM (Phase change Random Access Memory), RRAM (Resistive RAM), and MRAM (Magnetic RAM). The variable resistance material can be phase-change materials such as chalcogenide alloy (PRAM), or MTJ (Magnetic Tunnel Junction) thin films.

Because bit density in a traditional memory chip is determined by the number of memory cells in a chip, fine patterning is an key area to increase the bit density. In most cases, the technique is very costly because it needs more sophisticated lithography equipments and/or pattern correction techniques. An alternative approach, which is widely researched and applied in nonvolatile memory devices, is multi-level memory cell techniques in which a memory cell can store more than one bit.

For example, a PRAM can store more than one bit in a cell by changing the resistance level of the phase changing material into four or more levels.

While the accuracy of write/read operation is a great concern of this technology, minimizing read access time is also a concern of this technology because read access time usually increases as the number of stored bits in a cell increases.

SUMMARY OF THE INVENTION

An exemplary embodiment of the present invention includes a multi-level memory which includes a resistance element, wherein the resistance level of the resistance element is variable depending on data stored in the multi-level memory cell, and a read circuit which provides the multi level memory cell with a read bias and performs a sensing operation in response to the read bias, wherein the read bias has at least two different levels during a read cycle.

An exemplary embodiment of the present invention includes a multi-level memory cell which includes a resistance element, wherein the resistance level of the resistance element is variable depending on data stored in the multi-level memory cell, a driving bias generating circuit which generates a plurality of driving biases whose levels are different from each other, a plurality of switches which transfers the drive biases sequentially by responding to a selection signal, and a read circuit which provides the multi-level memory cell with a read bias whose level may vary sequentially by responding to the driving biases, and compares the level of a sensing node which is connected to the multi-level memory cell with the level of a reference bias.

An exemplary embodiment of the present invention includes a multi-level memory cell which is coupled to a word line and a bit line, and includes a resistance element whose resistance level is variable depending on data stored in the multi-level memory cell, a driving bias generating circuit which generates a plurality of different levels of drive biases; a sensing node which is coupled to the bit line; a plurality of read bias providing circuits which are coupled to the sensing node, and provides the sensing node with read bias by being sequentially enabled, wherein the read bias has at least two different levels during a read cycle.

BRIEF DESCRIPTION OF THE DRAWINGS

The above and other features and advantages of the present invention will become apparent by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. However, the invention may be embodied in many different forms and should not be construed as being limited to the embodiments set forth herein.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present.

Hereinafter, a phase change random access memory PRAM is described in exemplary embodiments of the present invention for purpose of illustration. The description is equally applicable to other nonvolatile memory devices such as resistive RAM (RRAM) and ferroelectric RAM (FRAM).

Figure 1:
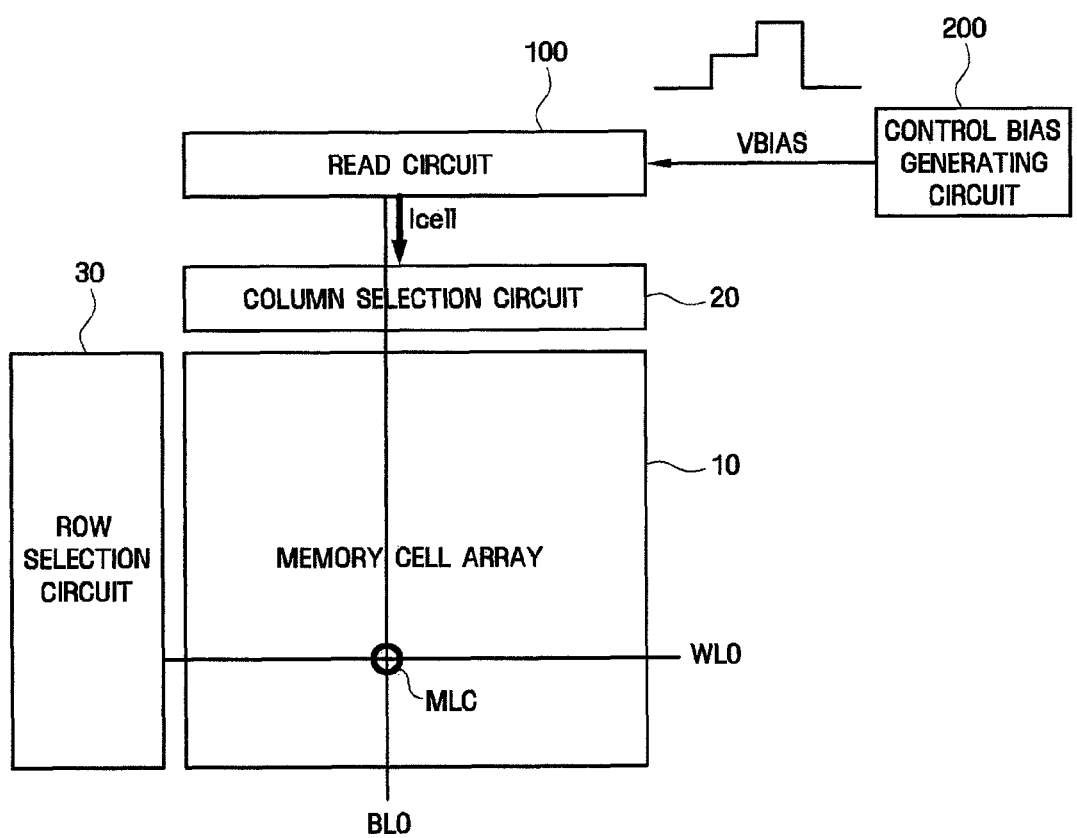
FIG. 1 is a block diagram illustrating a multi-level nonvolatile memory device according to an exemplary embodiment of the present invention.
Figure 2:
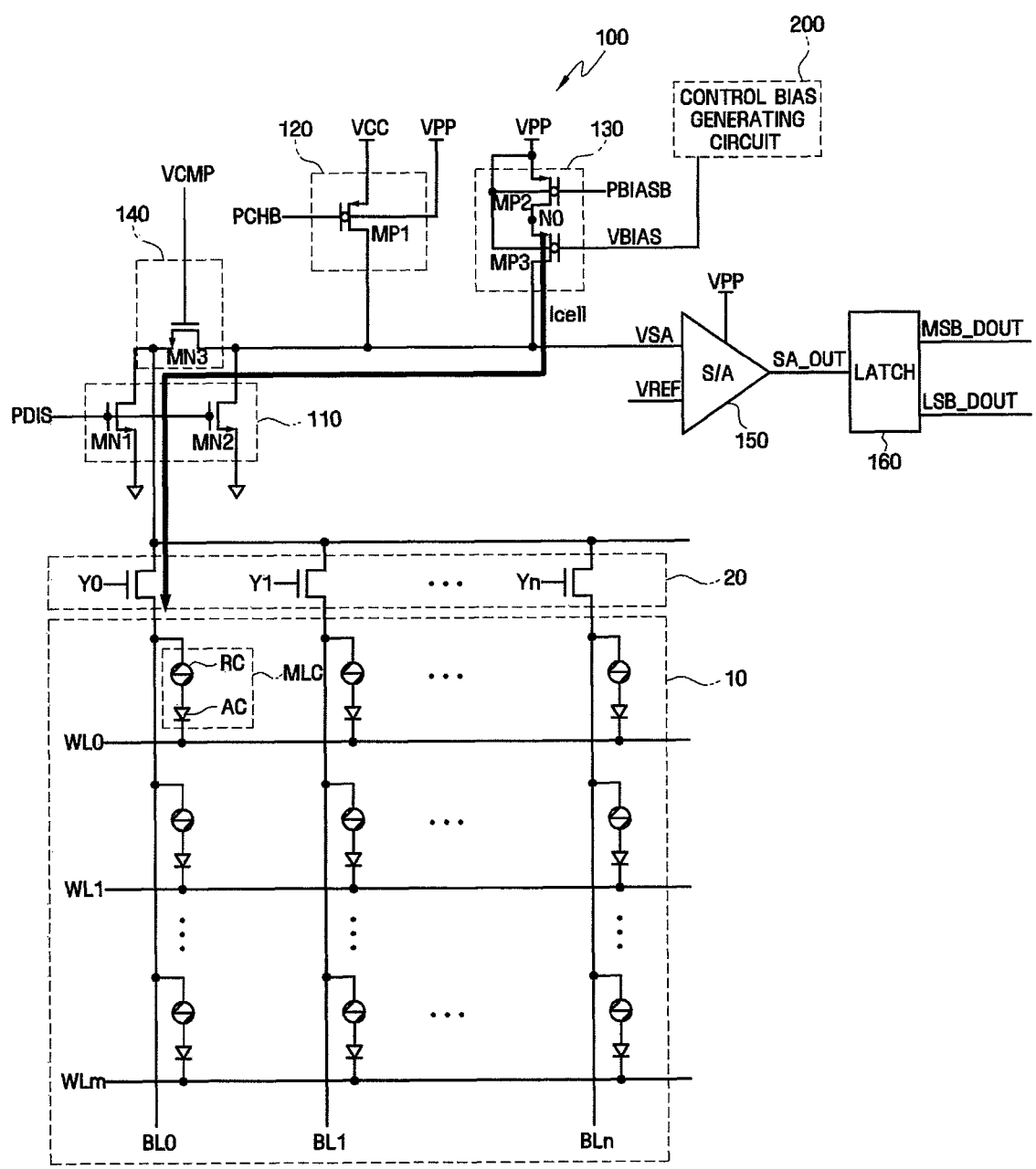
FIG. 2 is an exemplary circuit diagram illustrating blocks in FIG. 1.

FIG. 1 is a block diagram illustrating a multi-level nonvolatile memory device according to some exemplary embodiments of the present invention. FIG. 2 is a circuit diagram illustrating blocks in FIG. 1. For simplicity, a row selection circuit is not illustrated in FIG. 2.

Referring to FIGS. 1 and 2, a nonvolatile memory device according to exemplary embodiments of the present invention includes a memory cell array 10, a column selection circuit 20, a row selection circuit 30, a read circuit 100, and a control bias generating circuit 200.

The memory cell array 10 includes multiple multi-level memory cells MLC arranged in a matrix shape. Each of the multiple multi-level memory cells MLC is coupled to corresponding word lines WL0-WLm and to corresponding bit lines BL0-BLn. Each of the multi-level memory cells MLC also includes a variable resistance element RC. Variable resistance element RC includes a phase change material whose resistance can be changed into four or more different levels depending on the data stored in the cell. An access element AC controls flow of current through the variable resistance element RC. For example, the variable resistance element RC of a multi-level memory cell MLC that can store 2 bits can be changed into four different resistance levels depending on the state of cell data "00," "01," "10," or "11." The level of resistance can be ascending order for the sequence of data "00," "01," "10," and "11." The access element AC can be a diode or a transistor which is coupled to the variable resistance element RC in series. A diode is illustrated as an access element AC in the drawing. Various materials can be used as phase change material. For example, two element compounds such as GaSb, InSb, InSe, $Sb_2Te_3$, or GeTe, or three element compounds such as GeSbTe, GaSeTe, InSbTe, $SnSb_2Te_4$, or InSbGe, or four element compounds such as AgInSbTe, (GeSn)SbTe, GeSb(SeTe), $Te_{81}Ge_{15}Sb_2S_2$ can be used.

The row selection circuit 30 selects one of the word lines (for example, WL0) among the multiple word lines WL0-WLm, and the column selection circuit 20 selects of the bit lines (for example, BL0) among the multiple bit lines BL0-BLn.

The control bias generating circuit 200 provides the read circuit 100 (specially, read bias generating circuit 130) with a control bias VBIAS which has $2^N-1$ different voltage levels and varies in either ascending or descending order The read circuit 100 performs $2^N-1$ times of sensing operation successively by responding to each level of the control bias VBIAS. More particularly, the read circuit 100 generates a read bias Icell by responding to the control bias VBIAS and provides the selected multi-level memory cell MLC with the read bias Icell to read the resistance level of the multi-level memory cell MLC. The control bias VBIAS includes $2^N-1$ different current levels which may vary either in ascending or descending order. The read bias include $2^N-1$ different current levels and can vary in either ascending or descending order.

More particular illustration of read circuit 100, as illustrated in FIG. 2, includes a discharge circuit 110, a precharge circuit 120, a read-bias-generating circuit 130, a clamping circuit 140, and a sensing circuit 150, and a latch circuit 160.

The discharge circuit 110 discharges the bit line BL0 to the ground voltage VSS through an NMOS transistor MN1 by responding to a discharge signal PDIS and discharges the sensing node VSA to the ground voltage VSS through an NMOS transistor MN2 by responding to the discharge signal PDIS.

The precharge circuit 120 precharges the sensing node VSA to a predetermined level, such as source voltage level VCC during read operation by responding to a precharge signal PCHB.

The read-bias-generating circuit 130 responds to the control bias VBIAS and supplies the sensing node VSA with the read bias Icell to read the data of selected multi-level memory cell MLC. A basic principle of reading operation of a multi-level memory cell MLC is described in FIGS. 3 and 4. The read-bias-generating circuit 130 includes a PMOS transistor MP2 which is connected between operation voltage VPP and a node N0 and also is coupled to a selection signal PBIASB, and a PMOS transistor MP3 which is connected between the node N0 and the sensing node VSA and also is coupled to the control bias VBIAS. Each of the substrate regions of the PMOS transistors MP2 and MP3 is coupled to the operation voltage VPP.

The clamping circuit 140 clamps the voltage level of the bit line BL0 to control the voltage level within proper operating range. Specifically, it keeps voltage level of BL0 lower than the critical voltage Vth of the phase change materials. Otherwise, the phase of the phase change material of selected multi-level memory cell MLC can vary while performing read operations. The clamping circuit 140 can be an NMOS MN3, and is connected between the bit line BL0 and the sensing node VSA and also is coupled to a clamping signal VCMP through the gate. Here, the clamping control signal VCMP can be a voltage regulator signal, but is not limited thereto.

The sensing circuit 150 compares the level of the sensing node VSA and reference bias VREF and generate output signal SA_OUT. For example, when the sensing the level of the node VSA is higher than the level of the reference bias VREF, the logic level of comparison output SA_OUT becomes "high". In contrast, when the sensing the level of the node VSA is lower than the level of the reference bias VREF, the logic level of comparison output SA_OUT becomes "low". Specifically, the sensing operation is performed successively for each level of the read bias Icell, and comparison outputs are stored in different latch circuits. For example, if the number of the level of the read bias is $2^N-1$, the sensing operation is performed $2^N-1$ times successively. Though the sensing circuit 150 illustrates a voltage sensing scheme, it can be implemented with a current sense amplifier that compares current difference between the bit line BL0 of the selected multi-level memory cell MLC and a reference current. The voltage level of the reference bias VREF of the sensing circuit 150 may not change during the successive sensing operations.

The latch circuit 160 stores the comparison outputs SA_OUTs and generates corresponding 2-bit values, the upper bit data MSB_DOUT and the lower bit data LSB_DOUT. Specifically, the sensing circuit 150 generates the comparison outputs SA_OUTs for each current level of the read bias, and comparison outputs SA_OUTs are stored in the latch circuit 160 which outputs 2-bit values.

Figure 3:
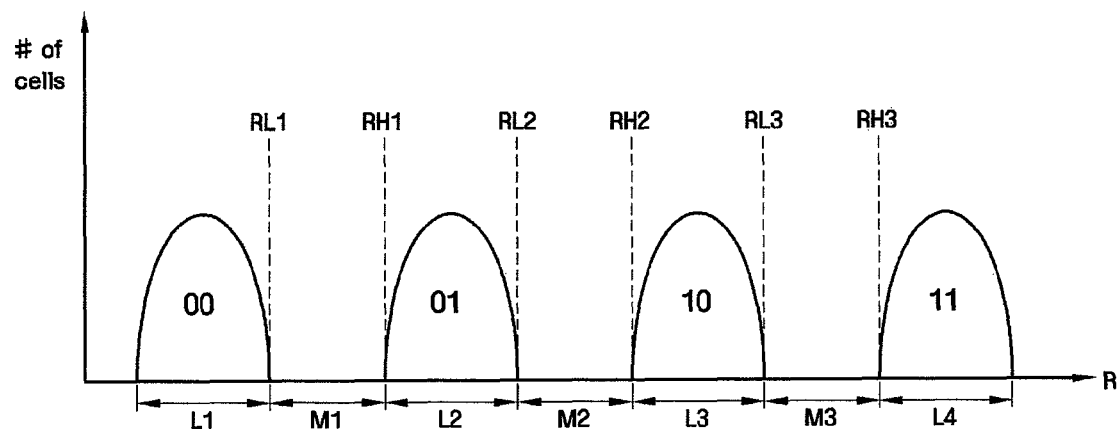
FIG. 3 is a graph illustrating resistance levels of a multi-level memory cell used in a multi-level nonvolatile memory device according to exemplary embodiments of the present invention.
Figure 4:
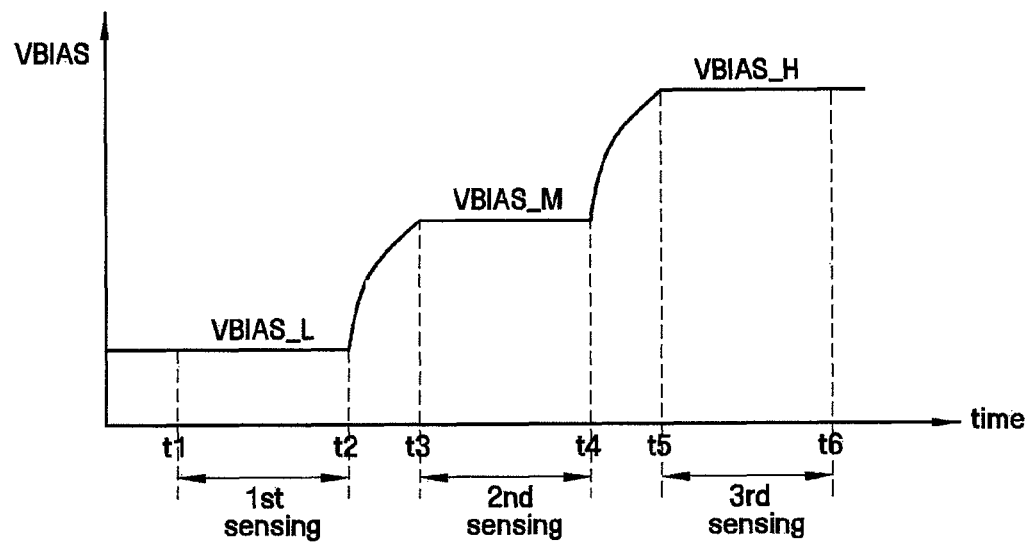
FIG. 4 is a graph illustrating a control bias used in a multi-level nonvolatile memory device according to an exemplary embodiment of the present invention.

Hereinafter, referring to FIGS. 2 through 5, read operations of a multi-level nonvolatile memory device according to exemplary embodiments of the present invention are described in detail. FIG. 3 is a graph illustrating resistance levels of a multi-level memory cell used in a multi-level nonvolatile memory device according to some exemplary embodiments of the present invention. FIG. 3 illustrates the resistance distribution of memory cells where multi-level memory cell stores 2 bits. The number of bits stored in a multi-level memory cell can be extended to 3 bits or more by increasing the states of resistance levels which memory cell groups may be positioned. FIG. 4 is a graph illustrating the control bias used in a multi-level nonvolatile memory device according to an exemplary embodiment of the present invention. The control bias circuit generates $2^N-1$ different levels of the control bias within one read cycle.

Referring FIG. 3, an x-axis represents resistance R, and a y-axis represents the number of memory cells. Each of the multiple nonvolatile memory cells stores one of the data "00," "01," "10," or "11." Each of data "00," "01," "10," and "11" corresponds to one of the four resistance levels L1, L2, L3, and L4. The first resistance level L1 is the lowest, and the fourth resistance level L4 is the highest. The second resistance level L2 and the third resistance level L3 locate between the first resistance level L1 and the fourth resistance level L4 and the third resistance level L3 is higher than the second resistance level L2. As illustrated in the graph, the first resistance level L1 is less than a first reference resistance RL1, the second resistance level L2 is greater than a second reference resistance RH1 and less than a third reference resistance RL2, the third resistance level L3 is greater than a fourth reference resistance RH2 and less than a fifth reference resistance RL3, and the fourth resistance level L4 is greater than the sixth reference resistance RH3.

Resistance margins M1, M2, and M3 are placed between four resistance levels L1, L2, L3, and L4. Specifically, the first resistance margin M1 is placed between the first resistance level L1 and the second resistance level L2, the second resistance margin M2 is placed between the second resistance level L2 and the third resistance level L3, and the third resistance margin M3 is placed between the third resistance level L3 and the fourth resistance level L4.

Referring to FIGS. 2 through 4, the multi-level memory cell MLC responds to $2^N-1$ different levels of the control bias VBIAS within one read cycle. During the read cycle, a read-bias-generating circuit 130 provides the multi-level memory cell MLC with different levels of the read bias by responding to a first level of the control bias VBIAS_L, a second level of the control bias VBIAS_M, and a third level of the control bias VBIAS_H. A sensing circuit 150 generates a comparison output SA_OUT for each of the different levels of the control bias VBIAS_L, VBIAS_M, and VBIAS_H.

The first level of the control bias VBIAS_L is adjusted to address a resistance level of a multi-level cell which is within a resistance margin M1. When sensing circuit operates to read data of a multi-level memory cell MLC by responding to the first level of the control bias VBIAS_L, the comparison output SA_OUT shows that whether the data stored in the multi-level memory cell MLC are data "00" or other data such as "01", "10" or "11."

A bias level of the second level of the control bias VBIAS_M is adjusted to address a resistance level of a multi-level cell which is within resistance margin M2. When sensing circuit operates by responding to the second step control bias VBIAS_M, the comparison output SA_OUT shows that whether the data stored in the multi-level memory cell MLC are data "00" or "01", or other data such as "10" or "11."

A bias level of the third level of the control bias VBIAS_H is adjusted to address a resistance level of a multi-level cell which is within resistance margin M3. When sensing circuit operates by responding to the third level of the control bias VBIAS_H, the comparison output SA_OUT shows that whether the data stored in the multi-level memory cell MLC are data "11" or other data such as "00", "01," or "10."

Assuming that one read cycle is performed during a time period of t1-t6, a first sensing is performed by responding to the first level of the control bias VBIAS_L during t1-t2. A second sensing is performed by responding to the second level of the control bias VBIAS_M during t3-t4, and the third sensing is performed by responding to the third level of the control bias VBIAS_H during t5-t6. The time periods t2-t3 and t4-t5 are set-up time required for settling down each level of the control bias before following sensing operation.

TABLE 1 summarizes a comparison outputs SA_OUTs after the first sensing, the second sensing, and the third sensing, and an upper bit data MSB_DOUT and a lower bit data LSB_DOUT which are final bit values stored in a latch circuit 160.

TABLE 1

| DATA | SA_OUT AFTER THE FIRST SENSING | SA_OUT AFTER THE SECOND SENSING | SA_OUT AFTER THE THIRD SENSING | FINAL OUTPUT MSB_DOUT | LSB_DOUT |
|---|---|---|---|---|---|
| "00" | "low" | "low" | "low" | "low" | "low" |
| "01" | "high" | "low" | "low" | "low" | "high" |
| "10" | "high" | "high" | "low" | "high" | "low" |
| "11" | "high" | "high" | "high" | "high" | "high" |

Referring to TABLE 1, in case of data "10", the comparison output SA_OUT after the first sensing operation is logic level "high", the comparison output SA_OUT generated after the second sensing operation is logic level "high," and the comparison output SA_OUT generated after the third sensing operation is logic level "low."

Before sensing operation, the levels of the upper bit data MSB_DOUT and lower bit data LSB_DOUT are set to logic level "low."

After the first sensing operation, the logic level of lower bit data LSB_DOUT is changed from "low" to "high" by responding to the logic level "high" of comparison output SA_OUT.

After the second sensing operation, the logic level of lower bit data LSB_DOUT is changed from "high" to "low" and the logic level of higher bit data MSB_DOUT is changed from "low" to "high" by responding to the logic level "high" of comparison output SA_OUT.

After the third sensing operation the logic level of lower bit data LSB_DOUT and higher bit data MSB_DOUT keep previous values by responding to the logic level "low" of comparison output SA_OUT.

Therefore, final logic values of the upper bit data MSB_DOUT and the lower bit data LSB_DOUT after sensing operations are logic level "high" and logic level "low" respectively respectively which represent bit data "10".

In case of data "00", the comparison output SA_OUT after the first sensing operation becomes logic level "low", the comparison output SA_OUT after the second sensing operation becomes logic level "low", and the comparison output SA_OUT after the third sensing operation becomes logic level "low". As the upper bit data MSB_DOUT and low level for the lower bit data LSB_DOUT of the latch circuit 160 are set to logic level "low" before sensing operation, both the upper bit data MSB_DOUT and low level for the lower bit data LSB_DOUT stay at logic level "low".

Although the sensing operation in the exemplary embodiment of the present invention illustrates the case where the level of the control bias is increased for following sensing, the illustration is equally applicable where the level of the control bias VBIAS is decreased for successive sensing operations.

The latch circuit 160 illustrates that the values of the upper bit data MSB_DOUT and the lower bit data LSB_DOUT is changed after each sensing operation. However, the latch circuit 160 can also be implemented to store the results until the completion of the three sensing operations and to generate final values of the upper bit data MSB_DOUT and the lower bit data LSB_DOUT after the third sensing operation. For example, if the comparison output SA_OUT generates logic level "high" after the first sensing operation, logic level "high" after the second sensing operation and logic level "high" after the third sensing operation, the latch circuit 160 outputs logic level "high" for the upper bit data MSB_DOUT and logic level "high" for the lower bit data LSB_DOUT after the third sensing while the bit data are not changed after the first and the second sensing operations.

Figure 5:
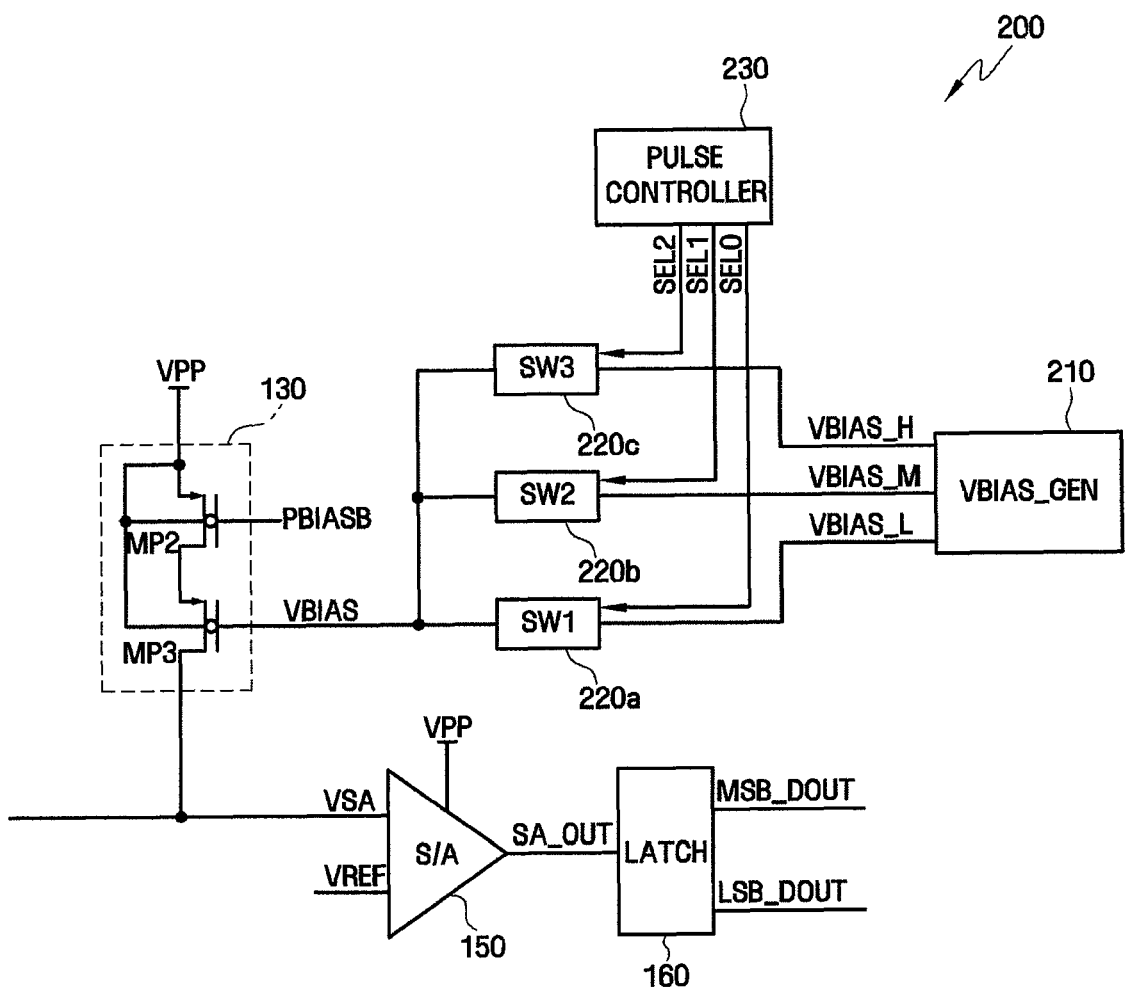
FIG. 5 is a block diagram illustrating a multi-level nonvolatile memory device according to an exemplary embodiment of the present invention.
Figure 6:
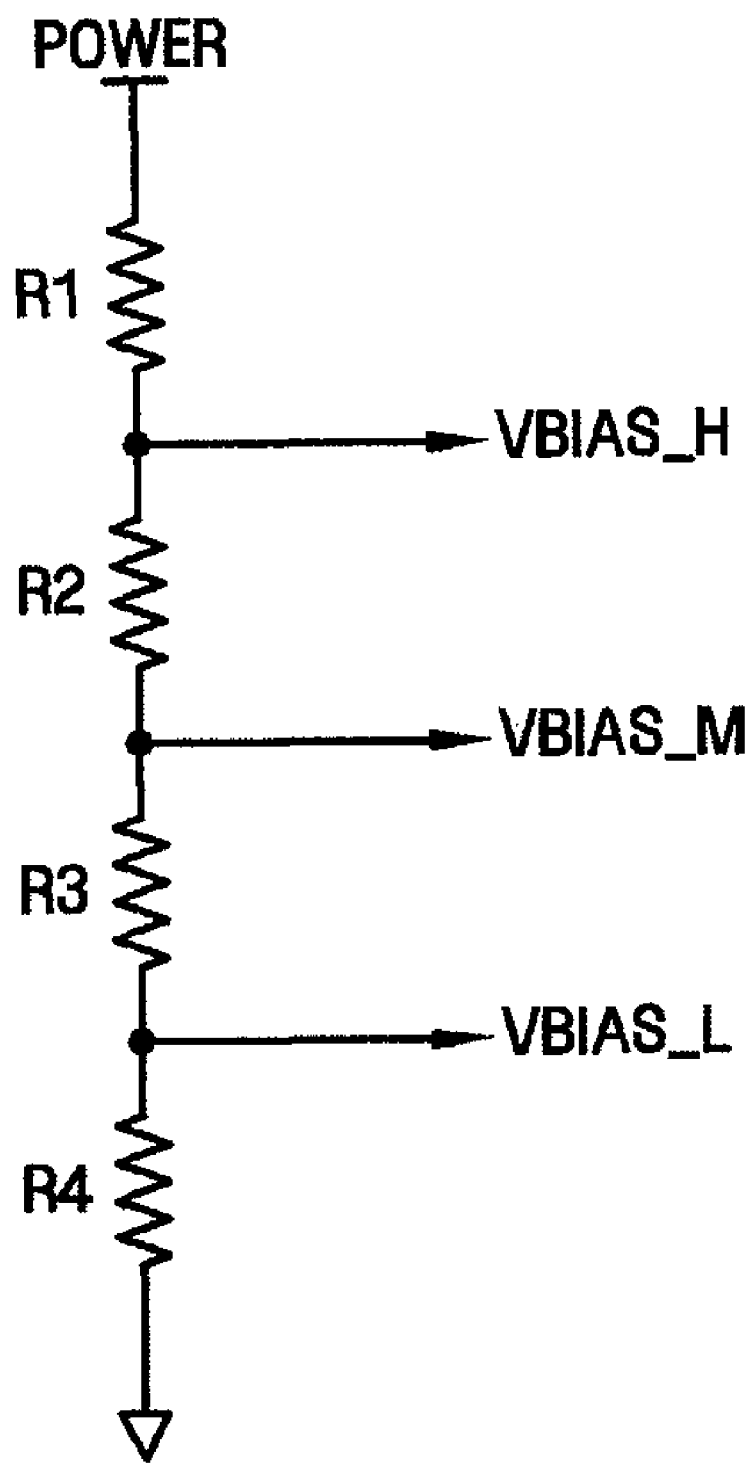
FIG. 6 is an example circuit diagram illustrating a drive bias generating circuit in FIG. 5.
Figure 7:
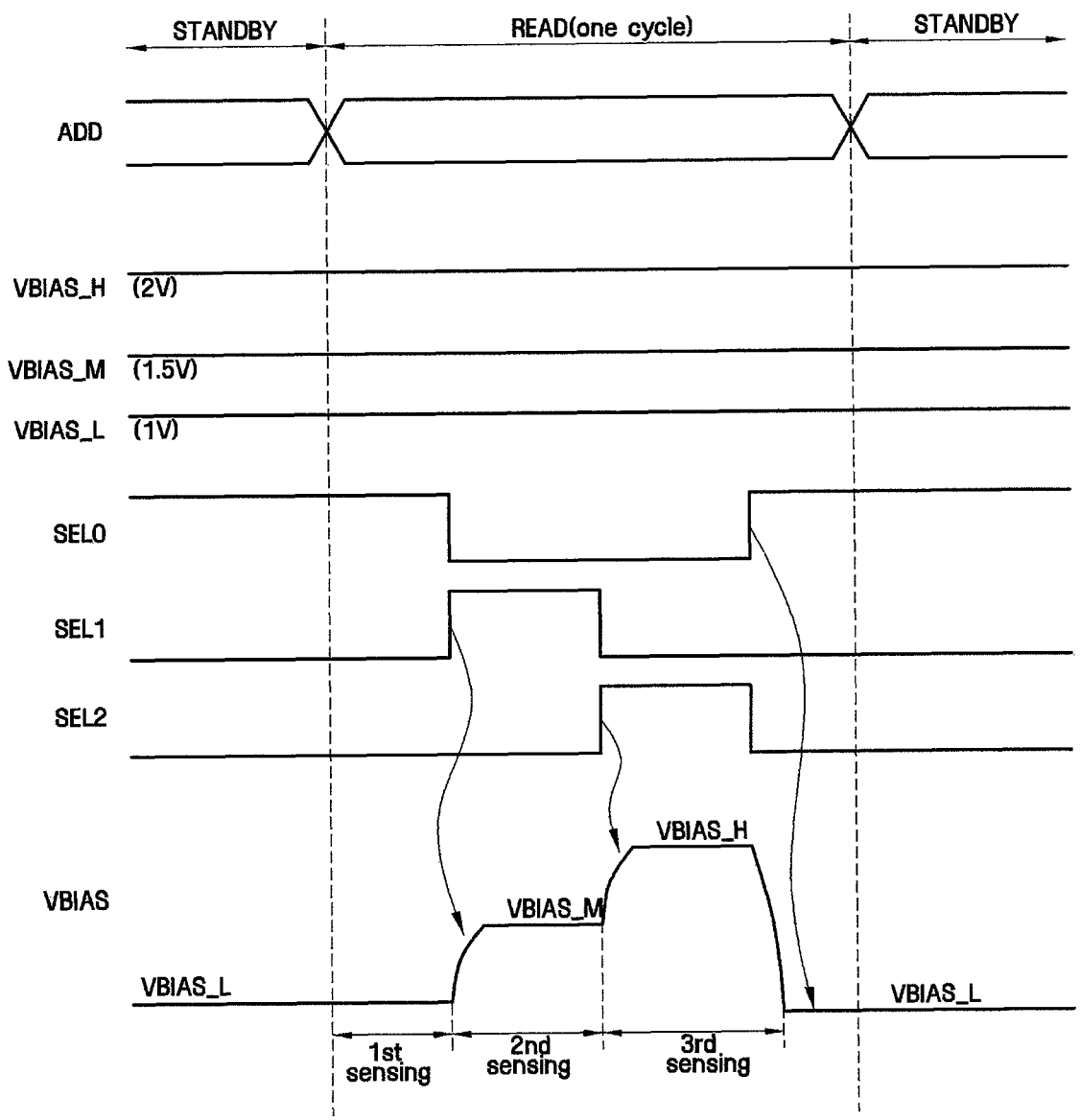
FIG. 7 is a timing diagram illustrating operations of the multi-level nonvolatile memory device in FIG. 5.

FIG. 5 is a block diagram illustrating a multi-level nonvolatile memory device according to an exemplary embodiment of the present invention, and illustrates the control bias generating circuit in FIG. 2 in detail. FIG. 6 is a circuit diagram illustrating an example of a drive bias generating circuit in FIG. 5. FIG. 7 is a timing diagram illustrating operations of the multi-level nonvolatile memory device in FIG. 5.

Referring to FIG. 5, a control bias generating circuit 200 includes a drive bias generating circuit 210, switches 220a, 220b, and 220c, and a pulse controller 230.

The drive bias generating circuit 210 generates a plurality of drive biases VBIAS_L, VBIAS_M, and VBIAS_H whose voltage levels are different from each other. For example, the drive bias VBIAS_H, the drive bias VBIAS_M, and the drive bias VBIAS_L can be 2 V, 1.5 V, and 1 V, respectively. The drive bias generating circuit 210, as illustrated in FIG. 6, is composed of resistors R1, R2, R3, and R4 connected in series and generates drive biases VBIAS_L, VBIAS_M, and VBIAS_H. The switches 220a, 220b, and 220c respond to selection signals SEL0, SEL1, and SEL2, and provide a read circuit (for example, the read bias generating circuit 130) with the drive biases VBIAS_L, VBIAS_M, and VBIAS_H sequentially. The pulse controller 230 provides the switches 220a, 220b, and 220c with selection signals SEL0, SEL1, and SEL2.

The selection signals SEL0, SEL1, and SEL2 enable the switches 220a, 220b, and 220c sequentially to provide the read bias generating circuit 130 with the drive biases VBIAS_L, VBIAS_M, and VBIAS_H sequentially. For example, a first level of the control bias corresponds to the drive bias VBIAS_L, a second level of the control bias corresponds to the drive bias VBIAS_M, and a third level of the control bias corresponds to the drive bias VBIAS_H.

The read bias generating circuit 130 provides corresponding multi-level memory cell MLC with different level of the read bias sequentially by responding to the drive biases VBIAS_L, VBIAS_M, and VBIAS_H.

The sensing circuit 150, by responding to different levels of the read bias, outputs a comparison output SA_OUT after each sensing operation Finally, the latch circuit 160 generate the upper bit data MSB_DOUT and low level for the lower bit data LSB_DOUT according to the three comparison outputs SA_OUTs which are stored in the latch circuit after each sensing operation.

Since the drive bias generating circuit 210 transfers pre-generated drive biases VBIAS_L, VBIAS_M, and VBIAS_H sequentially through the switches 220a, 220b, and 220c, each level of the control bias VBIAS is settled fast. Thus, the transition time between different levels of the control bias VBIAS in an exemplary embodiment of the present invention can be shorter than that of control bias whose level transits by responding to single drive bias whose voltages levels are changed during read operation. As a result, according to an exemplary embodiment of the present invention, read operation time which is required to perform a read cycle can be reduced.

Furthermore, the exemplary embodiments of the present invention can perform read operation reliably because three successive sensing operations are performed in one sensing circuit 150. Due to the mismatches between sensing circuits, parallel sensing method which performs three sensing operations with three different sensing circuits usually requires more resistance level margin between different memory cell data, and those margins limit the number of bits that can be stored in a multi-level memory cell MLC.

Referring to FIGS. 5 and 7, before entering into read operation, the logic level of a selection signal SEL0 is set to "high", and the drive bias VBIAS_L is transferred to the control bias VBIAS.

Read operation starts by responding to a command signal and address signal ADD.

After selecting corresponding multi-level memory cell MLC, the sensing circuit performs a first sensing operation. During the first sensing operation, the voltage level of the control bias VBIAS stays at the voltage level of the drive bias VBIAS_L.

Before a second sensing operation, a selection signal SEL0 transits to logic level "low" and a selection signal SEL1 transits to logic level "high", and the voltage level of the control bias VBIAS stays at the voltage level of the drive bias VBIAS_M during the second sensing operation.

Before a third sensing operation, a selection signal SEL1 transits to logic level "low" and a selection signal SEL2 transits to logic level "high", and the voltage level of the control bias VBIAS stays at the voltage level of the drive bias VBIAS_H during the third sensing operation.

When all the sensing operations are completed, the selection signal SEL2 transits to logic level "low" and the selection signal SEL0 transits to logic level "high".

Figure 8:
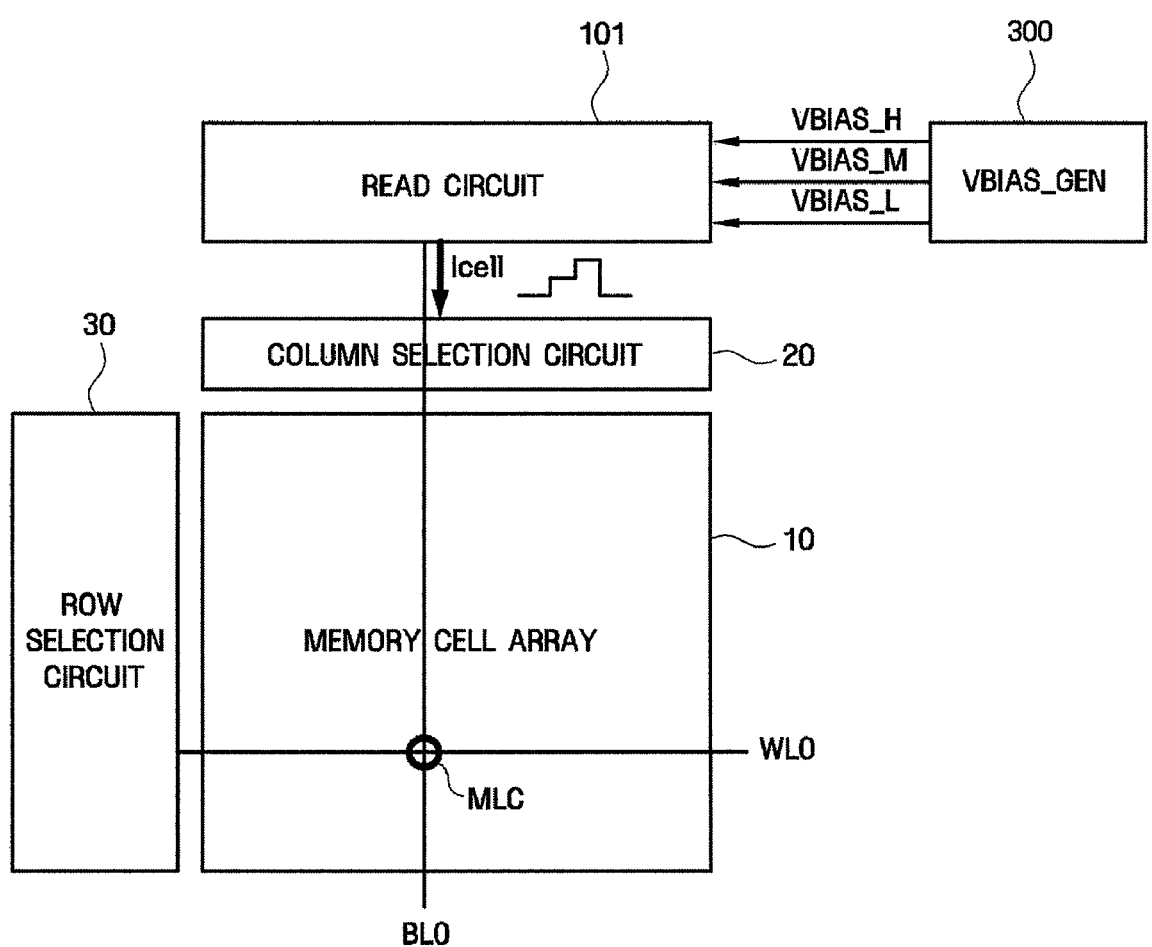
FIG. 8 is a block diagram illustrating a multi-level nonvolatile memory device according to another exemplary embodiment of the present invention.

FIG. 8 is a block diagram illustrating a multi-level nonvolatile memory device according to another exemplary embodiment of the present invention. FIG. is a circuit diagram illustrating the device of FIG. 8.

Figure 9:
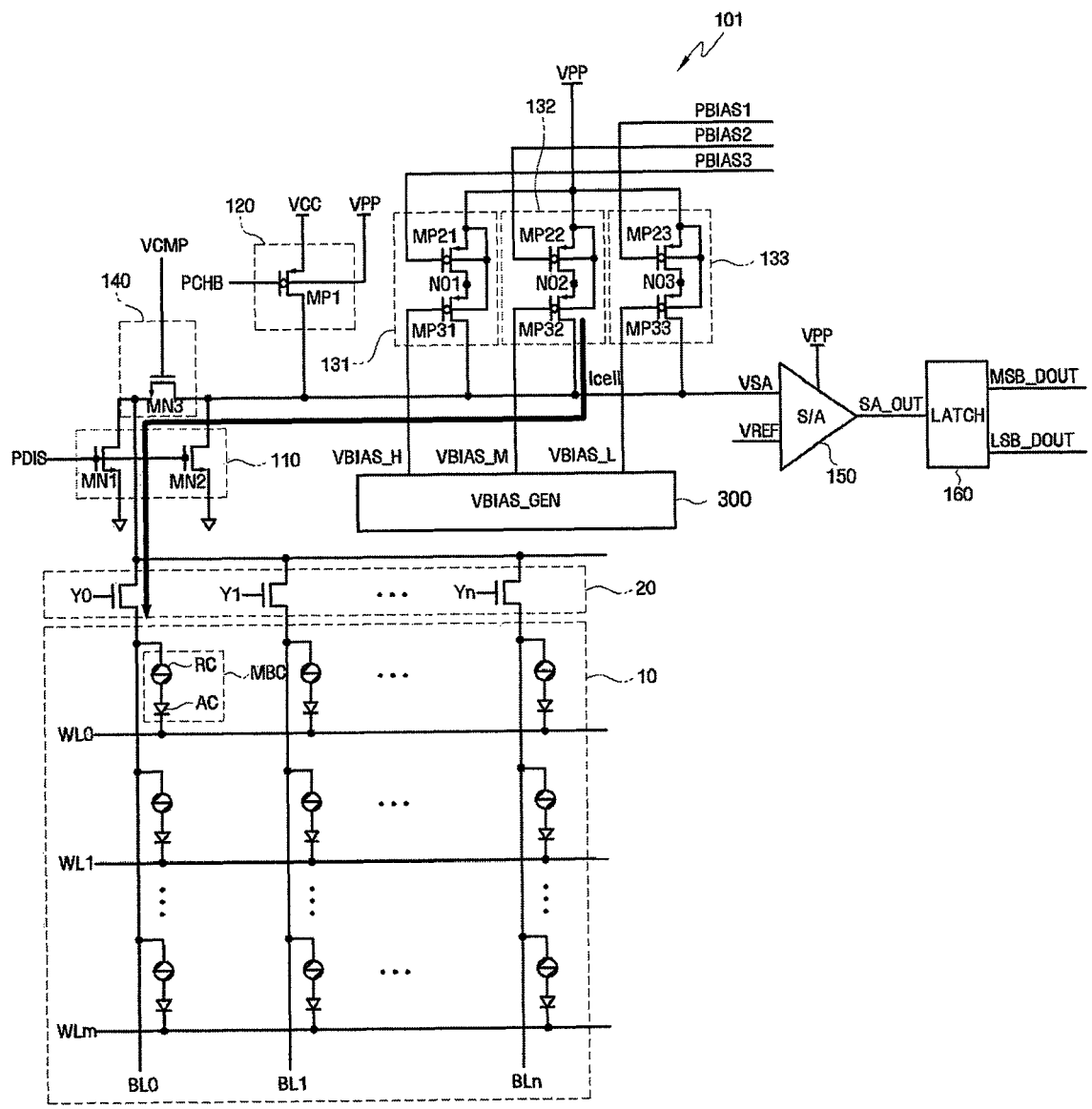
FIG. 9 is an exemplary circuit diagram of the device of FIG. 8.

Referring to FIGS. 1, 2, 8 and 9, the exemplary embodiment of FIGS. 8 and 9 does not include a bias generating circuit that provides a control bias VBIAS to the read circuit 100. The control bias VBIAS includes $2^N-1$ different current levels and can vary either in ascending or descending order. Further, a multiple of read bias providing units 131 to 133 provide different level driving biases VBIAS_H to VBIAS_L.

A nonvolatile memory apparatus according to the another exemplary embodiment of the present invention includes a memory cell array, a column selection circuit 20, a row selection circuit 30, a read circuit 101, and a driving bias providing unit 300. The memory cell array 10, the column selection circuit 20 and the row selection circuit 30 are practically the same as those explained in FIG. 1.

The driving bias providing unit 300 provides a plurality of driving biases VBIAS_H to VBIAS_L of different levels to the read circuit 101 (e.g., a plurality of read bias providing units 131 to 133). Here, the level of each driving bias VBIAS_H to VBIAS_L can correspond to the level of each terminal of the control bias VBIAS provided in the control bias generation circuit 200 of FIG. 1. Such a driving bias providing unit 300 may be constituted in a manner that is substantially the same as the driving bias generator 210 of FIG. 5.

The read circuit 101 is a circuit for reading data stored in a multi memory cell MLC selected within the memory cell array 10. The read circuit 101 is provided a plurality of driving biases VBIAS_H to VBIAS_L at different levels. The read circuit 101 provides step-shaped read biases Icell to the selected multi-level memory cell MLC, and reads the resistance level of the multi-level memory cell MLC. The read bias includes $2^N-1$ different current levels and can vary either in ascending or descending order.

As illustrated in FIG. 9, read circuit 101 may include a discharge unit 110, a precharge unit 120, a plurality of read bias providing units 131 to 133, a clamping unit 140, a sensing unit 150, and a latch unit 160. The discharge unit 110, the precharge unit 120, the read bias providing units 131 to 133, the clamping unit 140, the sensing unit 150, and the latch unit 160 are substantially the same as those explained with reference to FIG. 2.

The read bias providing units 131 to 133 provide a read bias Icell which includes $2^N-1$ current levels and can vary either in ascending or descending order to a sensing node VSA via driving biases VBIAS_H to VBIAS_L, and biasing signals PBIAS1 to PBIAS3 to read the resistance level of the selected multi-level memory cell MLC. For example, if biasing signals PBIAS1 to PBIAS3 are sequentially enabled, read bias providing units 131 to 133 are sequentially enabled, and driving biases VBIAS_H to VBIAS_L may be sequentially transmitted to the sensing node VSA. A method of reading the resistance level of the multi-level memory cell MLC using the resistance level of the multi-level memory cell MLC using the read bias Icell is substantially same as the method explained with reference to FIGS. 3 and 4. Each read bias providing unit 131 to 133 may be PMOS transistors MP21 to MP23 that are connected between operation voltage VPP and nodes N0 to N3, and receive biasing signals PBIASB1 to PBIASB3 as gates, and PMOS transistors MP31 to MP33 that are connected between nodes N01 to N03 and the sensing node VSA, and receives driving biases VBIAS_L to VBIAS_H as gates. The substrate region, where PMOS transistors MP21 to MP23, and MP31 to MP33 are formed, may be connected to operation voltage VPP.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A multi-level nonvolatile memory device comprising:
   a multi-level memory which includes a resistance element, wherein the resistance level of the resistance element corresponds to data stored in the multi-level memory cell; and
   a read circuit which includes a sensing circuit and provides the multilevel memory cell with a read bias and performs a sensing operation in response to the read bias, wherein the read bias has at least two different levels during corresponding sensing time periods in a read cycle.

2. The multi-level nonvolatile memory device of claim 1, wherein the read bias includes 2N−1 different levels, where N is the number of bits stored in a multi-level memory cell, in either ascending or descending order.

3. The multi-level nonvolatile memory device of claim 1, further comprising a control bias generating circuit that provides a control bias to the read circuit, wherein the control bias has at least two different levels during the read cycle.

4. The multi-level nonvolatile memory device of claim 3, wherein the control bias generating circuit includes a driving voltage generator which generates a plurality of drive biases at different levels and a plurality of switches which respond to corresponding selection signals.

5. The multi-level nonvolatile memory device of claim 3, wherein the level of the control bias varies in an ascending order and the level of the read bias varies in a descending order during the read cycle.

6. The multi-level nonvolatile memory device of claim 1, further comprising a driving voltage generator that generates a plurality of driving biases at different levels, wherein the read circuit includes a plurality of read bias providing units that are provided a plurality of driving biases and provide the read bias by being sequentially enabled, and each of the read bias providing units is provided each of the driving biases.

7. The multi-level nonvolatile memory device of claim 2, wherein the read circuit provides the multi-level memory cell with the read bias through a bit line which is connected to the multi-level memory cell.

8. The multi-level nonvolatile memory device of claim 7, wherein the read circuit includes a sensing node which is coupled to the bit line, and a sensing circuit which is coupled to the sensing node and generates a comparison output by comparing a level of the sensing node with a reference bias.

9. The multi-level nonvolatile memory device of claim 8, wherein the read circuit includes a latch circuit which is coupled to the sensing circuit and stores a multi-bit value depending on the comparison output.

10. The multi-level nonvolatile memory device of claim 9, wherein the sensing circuit generates 2N−1 comparison outputs by responding to 2N−1 different current levels of the read bias and the latch circuit stores 2N−1 comparison outputs and generates N-bit data depending on the comparison outputs.

11. The multi-level nonvolatile memory device of claim 8, wherein the level of the reference bias does not vary while the bias level of the read bias varies.

12. The multi-level of nonvolatile memory device of claim 2, wherein the multi-level memory cell is a phase change memory cell.

13. A multi-level nonvolatile memory device comprising:
   a multi-level memory cell which includes a resistance element, wherein the resistance level of the resistance element corresponds to data stored in the multi-level memory cell;
   a driving bias generating circuit which generates a plurality of driving biases at different levels;
   a plurality of switches which transfers the drive biases in response to a selection signal; and
   a read circuit which includes a sensing circuit and provides the multi-level memory cell with a read bias whose level varies in response to the driving biases, and compares the level of a sensing node which is connected to the multi-level memory cell with the level of a reference bias, wherein the read bias has at least two different levels during corresponding sensing time periods in a read cycle.

14. The multi-level nonvolatile memory device of claim 13, wherein the switches transfer the driving biases in either ascending or descending order.

15. The multi-level nonvolatile memory device of claim 13, wherein the read circuit performs sensing operation in response to each level of the read bias during a read cycle, wherein the read bias includes 2N−1 different levels, where N is the number of bits stored in a multi-level memory cell.

16. A multi-level nonvolatile memory device comprising:
- a multi-level memory cell which is coupled to a word line and a bit line, and includes a resistance element whose resistance level corresponds to data stored in the multi-level memory cell;
- a driving bias generating circuit which generates a plurality of drive biases at different levels;
- a sensing circuit comprising a sensing node which is coupled to the bit line;
- a plurality of read bias providing circuits which are coupled to the sensing node, and provides the sensing node with read bias by being sequentially enabled, wherein the read bias has at least two different levels during corresponding sensing time periods in a read cycle.

17. The multi-level nonvolatile memory device of claim 16, wherein the read bias includes 2N−1 different levels, where N is the number of bits stored in a multi-level memory cell, and can vary either ascending or descending order.

* * * * *